United States Patent
Ohnishi et al.

(10) Patent No.: US 7,740,996 B2
(45) Date of Patent: Jun. 22, 2010

(54) PHOTOSENSITIVE RESIN COMPOSITION AND COLOR FILTER

(75) Inventors: Hiroyuki Ohnishi, Kanagawa-ken (JP); Yasuaki Sugimoto, Kawasaki (JP)

(73) Assignee: Tokyo Ohka Kogyo Co., Ltd., Kawasaki-shi (JP)

(*) Notice: Subject to any disclaimer, the term of this patent is extended or adjusted under 35 U.S.C. 154(b) by 144 days.

(21) Appl. No.: 11/817,960

(22) PCT Filed: Dec. 2, 2005

(86) PCT No.: PCT/JP2005/022196
§ 371 (c)(1), (2), (4) Date: Sep. 6, 2007

(87) PCT Pub. No.: WO2006/095478
PCT Pub. Date: Sep. 14, 2006

(65) Prior Publication Data
US 2009/0023084 A1    Jan. 22, 2009

(30) Foreign Application Priority Data
Mar. 10, 2005  (JP) ............... 2005-066806

(51) Int. Cl.
G03F 7/023  (2006.01)
(52) U.S. Cl. .................... 430/7; 430/191; 430/192; 430/193
(58) Field of Classification Search ......... 430/7, 430/191, 192, 193
See application file for complete search history.

(56) References Cited

U.S. PATENT DOCUMENTS

| | | | |
|---|---|---|---|
| 4,910,119 A | | 3/1990 | Schneller et al. |
| 5,275,908 A | | 1/1994 | Elsaeser et al. |
| 5,376,496 A | | 12/1994 | Elsaeser et al. |
| 5,968,688 A | | 10/1999 | Masuda et al. |
| 6,083,658 A | * | 7/2000 | Kunita et al. ............. 430/270.1 |
| 6,319,650 B1 | * | 11/2001 | Gelorme et al. .......... 430/270.1 |
| 6,984,476 B2 | * | 1/2006 | Kobayashi et al. ............. 430/7 |
| 2004/0185372 A1 | | 9/2004 | Takakuwa |
| 2005/0043452 A1 | | 2/2005 | Araki |

FOREIGN PATENT DOCUMENTS

| | | |
|---|---|---|
| JP | 62-39603 | 2/1987 |
| JP | 64-35436 A | 2/1989 |
| JP | 2-69751 A | 3/1990 |
| JP | 4-175754 A | 6/1992 |
| JP | 4-212961 A | 8/1992 |
| JP | 4-213459 A | 8/1992 |
| JP | 6-230215 A | 8/1994 |
| JP | 7-84121 A | 3/1995 |
| JP | 2003-270784 | 9/2003 |

OTHER PUBLICATIONS

Search report in corresponding National Phase application PCT/JP2005/022196 with date stamped letter from European patent associate evidencing receipt of search report by Shiga International Patent Office on Dec. 28, 2005.
Office Action issued in the counterpart Taiwanese Patent Application No. 095101631, dated Oct. 7, 2009.

* cited by examiner

*Primary Examiner*—John S Chu
(74) *Attorney, Agent, or Firm*—Knobbe, Martens, Olson & Bear, LLP

(57) ABSTRACT

A positive photosensitive resin composition exhibiting excellent heat resistance is provided, which comprises an alkali-soluble resin component (A) and a photosensitizer (B), the component (A) including a resin component (A1) having a structural unit (a1) represented by general formula (a1) shown below:

[Chemical Formula 1]

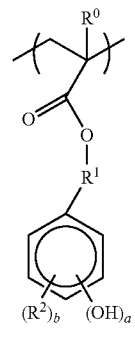

(a1)

wherein $R^0$ represents a hydrogen atom or a methyl group; $R^1$ represents a single bond or an alkylene group of 1 to 5 carbon atoms; $R^2$ represents an alkyl group of 1 to 5 carbon atoms; and a represents an integer of 1 to 5, and b represents 0 or an integer of 1 to 4, with the proviso that the sum of a and b is 5 or less, and when two or more $R^2$ are present, $R^2$ may be the same or different.

8 Claims, 2 Drawing Sheets

PHOTOSENSITIVE RESIN COMPOSITION AND COLOR FILTER

RELATED APPLICATIONS

This application is the U.S. National Phase filing under 35 U.S.C. §371 of PCT/JP2005/022196, filed Dec. 2, 2005, which designated the United States and was published in a language other than English, which claims priority under 35 U.S.C. §119(a)-(d) to Japanese Patent Application No. 2005-066806, filed Mar. 10, 2005. The content of these applications is incorporated herein by reference in their entireties.

TECHNICAL FIELD

The present invention relates to a photosensitive resin composition and a color filter.

BACKGROUND ART

Generally, electronic parts such as liquid crystal display devices, integrated circuit devices and solid-state image sensors are provided with color filters, interlayer insulation films and lenses. These color filters, interlayer insulation films and lenses are produced from a photosensitive resin composition, and are required to possess various properties such as transparency and heat resistance. For example, a color filter used for a color display apparatus provided with a liquid crystal display device typically has a structure in which pixels (color layer) of red (R), green (G) and blue (B) are surrounded by what is called a "black matrix" which is a lattice light-proof layer.

As a method for forming the color layer and light-proof layer (such as a black matrix) of a color filter, a photolithography method has been known in which a photosensitive resin composition containing a colorant is used.

As the photosensitive resin composition for producing a color layer or a light-proof layer (such as a black matrix) by the photolithography method, a "negative-type" which cures upon irradiation of light has been put into practical use. However, a photosensitive resin composition which contains a colorant used for forming a color filter by the photolithography method is required to be capable of forming a fine pattern such as a black matrix or a color layer (pixels) with an excellent profile. Therefore, it has been desired that the conventional "negative-type" be replaced by a "positive-type", and the "positive-type" has begun to be proposed (see Patent Document 1).

[Patent Document 1] Japanese Unexamined Patent Application, First Publication No. 2003-270784

DISCLOSURE OF INVENTION

Problems to be Solved by the Invention

However, when a conventional positive photosensitive resin composition containing a novolak resin, acrylic resin, hydroxystyrene resin or the like is used for producing a color filter, lenses or an interlayer insulation film, heat resistance was unsatisfactory. Further, for improving the color of the color filter, it is preferable that a pattern formed by using the photosensitive resin composition (which does not contain a colorant) have an excellent transparency. However, the conventional positive photosensitive resin composition was also unsatisfactory with respect to transparency.

Specifically, when the heat resistance is unsatisfactory, problems are caused in that shrinkage of the formed pattern (i.e., the film shrinkage) or collapse in the shape of pattern occurs during the typical heating process, so that a desired pattern cannot be formed. Further, when the resin component is discolored during the heating process, the required transparency cannot be obtained. Especially, in the case of a color filter, when the transparency is poor, a disadvantage is caused in that the predetermined colors of R, G, B and the like cannot be obtained.

The present invention takes the above circumstances into consideration, with an object of providing a positive-type photosensitive resin composition having excellent heat resistance and transparency.

Means to Solve the Problems

In order to achieve the above-mentioned object, the present invention adopts the following features.

The photosensitive resin composition according to the present invention includes an alkali-soluble resin component (A) and a photosensitizer (B), the component (A) including a resin component (A1) having a structural unit (a1) represented by general formula (a1) shown below:

[Chemical Formula 1]

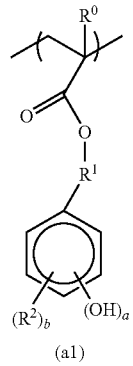

(a1)

wherein $R^0$ represents a hydrogen atom or a methyl group; $R^1$ represents a single bond or an alkylene group of 1 to 5 carbon atoms; $R^2$ represents an alkyl group of 1 to 5 carbon atoms; and a represents an integer of 1 to 5, and b represents 0 or an integer of 1 to 4, with the proviso that the sum of a and b is 5 or less, and when two or more $R^2$ are present, $R^2$ may be the same or different.

Further, the color filter according to the present invention is provided with a colorant layer and/or a light-proof layer made of a photosensitive resin composition of the present invention further containing a colorant (C).

The term "structural unit" refers to a monomer unit that contributes to the formation of a polymer.

Effect of the Invention

According to the present invention, a positive photosensitive resin composition exhibiting excellent heat resistance and transparency is provided.

Therefore, the photosensitive resin composition of the present invention can be advantageously used for a light-proof layer such as a black matrix.

Further, the photosensitive resin composition of the present invention can be advantageously used for a color layer of a color filter.

Further, according to the present invention, a color filter exhibiting excellent heat resistance and transparency is provided.

BEST MODE FOR CARRYING OUT THE INVENTION

Figure 1:
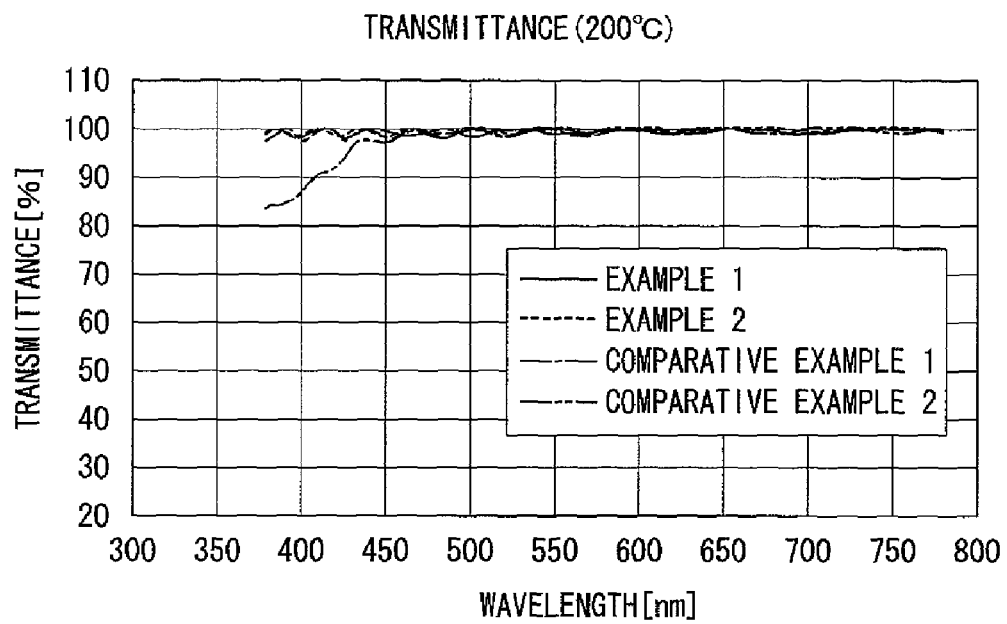
FIG. 1 is a graph showing the transparency of the respective test specimens heated at 200° C. in Examples 1 and 2 and Comparative Examples 1 and 2.

The photosensitive resin composition of the present invention includes an alkali-soluble resin component (A) (hereafter, abbreviated as "component (A)") and a photosensitizer (B) (hereafter, abbreviated as "component (B)"). The photosensitive resin composition of the present invention is of a positive-type which is rendered insoluble or hardly soluble in an alkali developing solution prior to exposure by the dissolution inhibiting action of the component (B), and which becomes soluble in an alkali developing solution by change of the component (B) upon exposure.

The component (A) includes a resin component (A1) having a structural unit (a1) represented by general formula (a1) above. By containing the structural unit (a1), the effects of the present invention are enhanced.

In general formula (a1) above, $R^0$ represents a hydrogen atom or a methyl group, preferably a methyl group.

$R^1$ represents a single bond, or a linear- or branched-chain alkylene group of 1 to 5 carbon atoms such as a methylene group, ethylene group, propylene group, isopropylene group, n-butylene group, isobutylene group, tert-butylene group, pentylene group, isopentylene group, or neopentylene group. As the alkylene group, a methyelne group or ethylene group is preferable.

Among these, a single bond or an ethylene group is preferable, and a single bond is particularly desirable.

$R^2$ represents a linear- or branched-chain alkyl group of 1 to 5 carbon atoms such as a methyl group, ethyl group, propyl group, isopropyl group, n-butyl group, isobutyl group, tert-butyl group, pentyl group, isopentyl group, or neopentyl group. From industrial viewpoint, a methyl group or ethyl group is preferable.

a represents an integer of 1 to 5, but is preferably 1 in consideration of effect and production.

b represents 0 or an integer of 1 to 4, but is preferably 0.

Further, with respect to the bonding position of the hydroxyl group in the benzene ring, it is preferable that at least one hydroxyl group be bonded at the fourth position when the bonding position of "—C(O)—O—$R^1$—" is regarded as the first position.

The preferable structural units in the present invention are exemplified below.

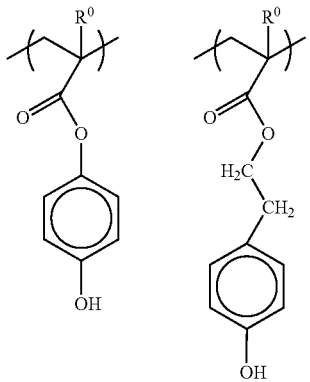

[Chemical Formula 2]

(a1-1)                (a1-2)

wherein in the general formulas above, $R^0$ is as defined above.

Among these, the structural unit represented by general formula (a1-1) is more preferable.

Hereafter, the structural unit represented by general formula (a1-1) above in which $R^0$ is a methyl group is frequently referred to as "PQMA", and the structural unit represented by general formula (a1-2) above in which $R^0$ is a methyl group is frequently referred to as "PEMA". Of these, PQMA is particularly desirable.

As the structural unit (a1), one type of structural unit may be used, or two or more types may be used in combination.

The resin component (A1) may contain one or more structural units other than the structural unit (a1) which are copolymerizable with the structural unit (a1).

The amount of structural unit (a1) based on the combined total of all structural units constituting the resin component (A1) is preferably 50 mol % or more, more preferably 70 mol %, and 100 mol % is particularly desirable.

When the amount of the structural unit (a1) is within the above-mentioned range, the effects of the present invention can be enhanced.

In the resin component (A1), there is no particular limitation to the structural units other than the structural unit (a1) which are usable. Examples of such structural units include structural units derived from compounds having a polymerizable unsaturated bond, such as acrylic acid, methacrylic acid, acrylic acid esters, acrylamides, methacrylic acid esters, methacrylamides, allyl compounds, vinyl ethers, vinyl esters, styrene compounds, and crotonates.

Specific examples of acrylate esters include alkyl acrylates in which the alkyl group preferably has 1 to 10 carbon atoms (e.g., methyl acrylate, ethyl acrylate, propyl acrylate, butyl acrylate, amyl acrylate, ethylhexyl acrylate, octyl acrylate, t-octyl acrylate, chloroethyl acrylate, 2,2-dimethylhydroxypropyl acrylate, 2-hydroxyethyl acrylate, 5-hydroxypentyl acrylate, trimethylolpropane monoacrylate, pentaerythritol monoacrylate, glycidyl acrylate, benzyl acrylate, methoxybenzyl acrylate, furfuryl acrylate, and tetrahydrofurfuryl acrylate), and aryl acrylates (e.g., phenyl acrylate).

Specific examples of methacrylate esters include alkyl methacrylates in which the alkyl group preferably has 1 to 10 carbon atoms (e.g., methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, glycidyl methacrylate, furfuryl methacrylate, and tetrahydrofurfuryl methacrylate), and aryl methacrylates (e.g., phenyl methacrylate, cresyl methacrylate and naphthyl methacrylate).

Specific examples of acrylamides include acryl amide, N-alkylacrylamides (in which the alkyl group is preferably an alkyl group of 1 to 10 carbon atoms, such as a methyl group, ethyl group, propyl group, butyl group, t-butyl group, heptyl group, octyl group, cyclohexyl group, hydroxyethyl group, or benzyl group), N-arylacrylamides (in which examples of the aryl group include a phenyl group, tolyl group, nitrophenyl group, naphthyl group, or hydroxyphenyl group), N,N-dialkylacrylamides (in which the alkyl group is preferably an alkyl group of 1 to 10 carbon atoms, such as a methyl group, ethyl group, butyl group, isobutyl group, ethylhexyl group, or cyclohexyl group), N,N-arylacrylamides (in which example of the aryl group include a phenyl group), N-methyl-N-phenylacrylamide, N-hydroxyethyl-N-methylacrylamide, and N-2-acetoamideethyl-N-acetylacrylamide.

Specific examples of methacrylamides include methacryl amide, N-alkylmethacrylamides (in which the alkyl group is preferably an alkyl group of 1 to 10 carbon atoms, such as a methyl group, ethyl group, t-butyl group, ethylhexyl group, hydroxyethyl group, or cyclohexyl group), N-arylmethacrylamides (in which example of the aryl group include a phenyl group), N,N-dialkylmethacrylamides (in which examples of the alkyl group include an ethyl group, propyl group, and butyl group), N,N-diarylmethacrylamides (in which example of the aryl group include a phenyl group), N-hydroxyethyl-N-methylmethacrylamide, N-methyl-N-phenylmethacrylamide, and N-ethyl-N-phenylmethacrylamide.

Specific examples of allyl compounds include allyl esters (e.g., allyl acetate, allyl caproate, allyl caprylate, allyl laurate, allyl palmitate, allyl stearate, allyl benzoate, allyl acetoacetate, and allyl lactate), and allyloxyethanol.

Specific examples of vinyl ethers include alkyl vinyl ethers (e.g., hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether and tetrahydrofurfuryl vinyl ether), and vinyl aryl ethers (e.g., vinyl phenyl ether, vinyl tolyl ether, vinyl chlorophenyl ether, vinyl-2,4-dichlorophenyl ether, vinyl naphthyl ether and vinyl anthranyl ether).

Specific examples of vinyl esters include vinyl butylate, vinyl isobutylate, vinyltrimethyl acetate, vinyldiethyl acetate, vinyl valerate, vinyl caproate, vinyl chloroacetate, vinyl dichloroacetate, vinyl methoxyacetate, vinyl butoxyacetate, vinyl phenylacetate, vinyl acetoacetate, vinyl lactate, vinyl-p-phenylbutyrate, vinyl cyclohexylcarboxylate, vinyl benzoate, vinyl salicylate, vinyl chlorobenzoate, vinyl tetrachlorobenzoate and vinyl naphthoate.

Specific examples of styrene compounds include styrene, alkylstyrenes (e.g., methylstyrene, dimethylstyrene, trimethylstyrene, ethylstyrene, diethylstyrene, isopropylstyrene, butylstyrene, hexylstyrene, cyclohexylstyrene, decylstyrene, benzylstyrene, chloromethylstyrene, trifluoromethylstyrene, ethoxymethylstyrene and acetoxymethylstyrene), alkoxystyrenes (e.g., methoxystyrene, 4-methoxy-3-methylstyrene and dimethoxystyrene), halogen styrenes (e.g., chlorostyrene, dichlorostyrene, trichlorostyrene, tetrachlorostyrene, pentachlorostyrene, bromostyrene, dibromostyrne, iodostyrene, fluorostyrene, trifluorostyrene, 2-bromo-4-trifluoromethylstyrene and 4-fluoro-3-trifluoromethylstyrene).

Specific examples of crotonates include alkyl crotonates (e.g., butyl crotonate, hexyl crotonate and glycerol monocrotonate). Examples of compounds having a polymerizable unsaturated bond also include dialkyl itaconates (e.g., dimethyl itaconate, diethyl itaconate and dibutyl itaconate), dialkyl esters of maleic acid or fumaric acid (e.g., dimethyl maleate and dibutyl fumarate), acrylonitrile, and methacrylonitrile.

Of these, structural units represented by general formulas (a2) to (a4) shown below are preferable.

[Chemical Formula 3]

(a2)

wherein $R^0$ is as defined above; $R^3$ represents a hydroxyl group or an alkyl group of 1 to 5 carbon atoms; c represents 0 or an integer of 1 to 5; and when two or more $R^3$ are present, $R^3$ may be the same or different.

In general formula (a2) above, $R^0$ is as defined above.

The alkyl group of 1 to 5 carbon atoms as $R^3$ is the same as the alkyl group as $R^2$ described above.

c represents 0 or an integer of 1 to 5, but is preferably 0.

[Chemical Formula 4]

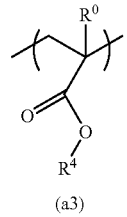

(a3)

wherein $R^0$ is as defined above; and $R^4$ represents an alkyl group of 1 to 5 carbon atoms, or a hydrogen atom.

In general formula (a3) above, $R^0$ is as defined above.

$R^4$ represents an alkyl group of 1 to 5 carbon atoms, or a hydrogen atom. As the alkyl group, the same alkyl groups as $R^2$ described above can be exemplified. Among the alkyl groups, a methyl group is particularly desirable.

[Chemical Formula 5]

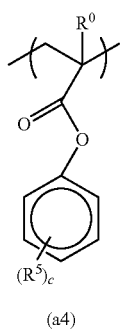

(a4)

wherein $R^0$ and c are as defined above; $R^5$ represents an alkyl group of 1 to 5 carbon atoms; and when two or more $R^5$ are present, $R^5$ may be the same or different.

In general formula (a4), $R^0$ and c are as defined above. $R^5$ represents an alkyl group of 1 to 5 carbon atoms.

The weight average molecular weight (Mw: the polystyrene equivalent weight average molecular weight determined by gel permeation chromatography (GPC)) of the component (A1) is 2,000 to 30,000, and preferably 3,000 to 25,000. By making the weight average molecular weight at least as large as the lower limit of the above-mentioned range, the resin can be easily formed into a film. On the other hand, by making the weight average molecular weight no more than the upper limit of the above-mentioned range, an appropriate alkali solubility can be obtained.

Further, as the component (A1), one type can be used alone, or a combination of two or more types may be used.

The component (A) may contain an alkali-soluble resin other than the component (A1). Examples of such alkali-soluble resins include acrylic resins, hydroxystyrene resins and novolak resins.

However, the content of the component (A1) within the component (A) is 70% by weight or more, preferably 80% by weight or more, and most preferably 100% by weight.

Photosensitizer (B)

The photosensitizer (B) is capable of enhancing the alkali solubility of the component (A) in an alkali solution (e.g., an aqueous solution of tetramethylammonium hydroxide) by irradiation of ultraviolet ray or the like. As the photosensitizer (B), a photosensitizer having a quinonediazide group (i.e., a quinonediazide group-containing compound) is preferable.

As the quinonediazide group-containing compound, for example, an esterification product or partial esterification product of a phenolic compound with a naphthoquinonediazidesulfonic acid compound can be mentioned.

Specific examples of phenolic compounds include polyhydroxybenzophenone compounds such as 2,3,4-trihydroxybenzophenone and 2,3,4,4'-tetrahydroxybenzophenone;

tris-phenol type compounds such as tris(4-hydroxyphenyl)methane, bis(4-hydroxy-3-methylphenyl)-2-hydroxyphenylmethane, bis(4-hydroxy-2,3,5-trimethylphenyl)-2-hydroxyphenylmethane, bis(4-hydroxy-3,5-dimethylphenyl)-4-hydroxyphenylmethane, bis(4-hydroxy-3,5-dimethylphenyl)-3-hydroxyphenylmethane, bis(4-hydroxy-3,5-dimethylphenyl)-2-hydroxyphenylmethane, bis(4-hydroxy-2,5-dimethylphenyl)-4-hydroxyphenylmethane, bis(4-hydroxy-2,5-dimethylphenyl)-3-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-2,5-dimethylphenyl)-2,4-dihydroxyphenylmethane, bis(4-hydroxyphenyl)-3-methoxy-4-hydroxyphenylmethane, bis(5-cyclohexyl-4-hydroxy-2-methylphenyl)-4-hydroxyphenylmethane, bis(5-cyclohexyl-4-hydroxy-2-methylphenyl)-3-hydroxyphenylmethane, bis(5-cyclohexyl-4-hydroxy-2-methylphenyl)-2-hydroxyphenylmethane, and bis(5-cyclohexyl-4-hydroxy-2-methylphenyl)-3,4-dihydroxyphenylmethane;

linear three benzene ring type phenol compounds such as 2,4-bis(3,5-dimethyl-4-hydroxybenzyl)-5-hydroxyphenol, and 2,6-bis(2,5-dimethyl-4-hydroxybenzyl)-4-methylphenol;

linear four benzene ring type phenol compounds such as 1,1-bis[-(2-hydroxy-5-methylbenzyl)-4-hydroxy-5-cyclohexylphenyl]isopropane, bis[2,5-dimethyl-3-(4-hydroxy-5-methylbenzyl)-4-hydroxyphenyl]methane, bis [2,5-dimethyl-3-(4-hydroxybenzyl)-4-hydroxyphenyl]methane, bis [3-(3,5-dimethyl-4-hydroxybenzyl)-4-hydroxy-5-methylphenyl]methane, bis[3-(3,5-dimethyl-4-hydroxybenzyl)-4-hydroxy-5-ethylphenyl]methane, bis[3-(3,5-diethyl-4-hydroxybenzyl)-4-hydroxy-5-methylphenyl]methane, bis[3-(3,5-diethyl-4-hydroxybenzyl)-4-hydroxy-5-ethylphenyl]methane, bis[2-hydroxy-3-(3,5-dimethyl-4-hydroxybenzyl)-5-methylphenyl]methane, bis[2-hydroxy-3-(2-hydroxy-5-methylbenzyl)-5-methylphenyl]methane, bis [4-hydroxy-3-(2-hydroxy-5-methylbenzyl)-5-methylphenyl]methane, and bis[2,5-dimethyl-3-(2-hydroxy-5-methylbenzyl)-4-hydroxyphenyl]methane;

linear polyphenol compounds including linear five benzene ring type phenol compounds such as 2,4-bis[2-hydroxy-3-(4-hydroxybenzyl)-5-methylbenzyl]-6-cyclohexylphenol, 2,4-bis[4-hydroxy-3-(4-hydroxybenzyl)-5-methylbenzyl]-6-cyclohexylphenol, and 2,6-bis[2,5-dimethyl-3-(2-hydroxy-5-methylbenzyl)-4-hydroxybenzyl]-4-methylphenol;

bisphenol type compounds such as bis(2,3,4-trihydroxyphenyl)methane, bis(2,4-dihydroxyphenyl)methane, 2,3,4-trihydroxyphenyl-4'-hydroxyphenylmethane, 2-(2,3,4-trihydroxyphenyl)-2-(2',3',4'-trihydroxyphenyl)propane, 2-(2,4-dihydroxyphenyl)-2-(2','-dihydroxyphenyl)propane, 2-(4-hydroxyphenyl)-2-(4'-hydroxyphenyl)propane, 2-(3-fluoro-4-hydroxyphenyl)-2-(3'-fluoro-4'-hydroxyphenyl)propane, 2-(2,4-dihydroxyphenyl)-2-(4'-hydroxyphenyl)propane, 2-(2,3,4-trihydroxyphenyl)-2-(4'-hydroxyphenyl)propane, and 2-(2,3,4-trihydroxyphenyl)-2-(4'-hydroxy-3',5'-dimethylphenyl)propane;

polynuclear branched compounds such as 1-[1-(4-hydroxyphenyl)isopropyl]-4-[1,1-bis(4-hydroxyphenyl)ethyl]benzene, and 1-[1-(3-methyl-4-hydroxyphenyl)isopropyl]-4-[1,1-bis(3-methyl-4-hydroxyphenyl)ethyl] benzene; and condensation type phenol compounds such as 1,1-bis(4-hydroxyphenyl)cyclohexane.

These compounds can be used individually or in combination.

Specific examples of naphthoquinonediazidesulfonic acid compounds include naphthoquinone-1,2-diazide-5-sulfonic acid and naphthoquinone-1,2-diazide-4-sulfonic acid.

As the component (B), other naphthoquinonediazide group-containing compounds not among the preferred naphthoquinonediazide group-containing compounds exemplified above can also be used. Examples of such naphthoquinonediazide group-containing compounds include nucleophilic-substitution derivatives of orthobenzoquinonediazide, orthonaphthoquinonediazide, orthoantraquinonediazide, orthonaphthoquinonedizaide sulfonate, or the like; and a reaction product of orthoquinonediazidesulfonylchloride with a compound having a hydroxyl group or amino group such as phenol, p-methoxyphenol, dimethylphenol, hydroquinone, bisphenol-A, naphthol, pyrocatechol, pyrogallol, pyrogallol monomethyl ether, pyrogallol-1,3-dimethyl ether, gallic acid, partially esterified or etherified gallic acid, aniline, or p-aminodiphenylamine. These may be used individually or in combination.

These quinonediazide group-containing compounds can be produced for example by placing the above-mentioned polyhydroxybenzophenone and naphthoquinone-1,2-diazide-5-sulfonyl chloride or naphthoquinone-1,2-diazide-4-sulfonyl chloride in an appropriate solvent such as dioxane, and performing condensation in the presence of an alkali such as triethanolamine, a carbonate or a hydrogencarbonate, thereby entirely or partially esterifying the polyhydroxybenzophenone.

As the quinonediazide group-containing compound, a naphthoquinonediazide sulfonic ester as exemplified above is preferable.

As the component (B), one type may be used, or two or more types may be used in combination.

The component (B) is preferably used in an amount within the range of 5 to 200 parts by weight, and more preferably 20 to 100 parts by weight, relative to 100 parts by weight of the component (A) used.

By using the component (B) in an amount within the above-mentioned range, the homogeneity of the film becomes satisfactory, and hence, the resolution is enhanced. Further, the faithfulness of a pattern obtained by exposure and developing is enhanced, and hence, transferability is enhanced.

Colorant (C)

In the manufacture of a color filter, a colorant (C) is generally added to the photosensitive resin composition for forming a light-proof layer (e.g., a black matrix) or color layer.

The colorant may be an organic colorant or an inorganic colorant. The color of the colorant is not particularly limited, and the color can be appropriately selected depending on the color of the color layer of the color filter to be obtained, or the color of the light-proof layer (e.g., black matrix) to be obtained.

As the organic colorant, a dye, an organic pigment, or a natural pigment is preferable. As the inorganic colorant, an inorganic pigment or an inorganic salt such as barium sulfate (i.e., the so-called extender pigment) is preferable.

As the colorant in the application of color filters, those which exhibit excellent color and excellent heat resistance, especially excellent resistance to heat decomposition, are preferable. In general, from the viewpoint of heat resistance, a pigment is preferable, and an organic pigment is particularly desirable.

As the organic pigment, for example, compounds which are classified as pigments in the Color Index (C.I.; published by The Society of Dyers and Colourists) can be mentioned. Specific examples of such compounds include those which are designated the following color index (C.I.) numbers:

C.I. pigment yellow 1 (hereafter, "C.I. pigment yellow" is abbreviated, and only the numbers are indicated), 3, 11, 12, 13, 14, 15, 16, 17, 20, 24, 31, 53, 55, 60, 61, 65, 71, 73, 74, 81, 83, 86, 93, 95, 97, 98, 99, 100, 101, 104, 106, 108, 109, 110, 113, 114, 116, 117, 119, 120, 125, 126, 127, 128, 129, 137, 138, 139, 147, 148, 150, 151, 152, 153, 154, 155, 156, 166, 167, 168, 175, 180, 185;

C.I. pigment orange 1 (hereafter, "C.I. pigment orange" is abbreviated, and only the numbers are indicated), 5, 13, 14, 16, 17, 24, 34, 36, 38, 40, 43, 46, 49, 51, 55, 59, 61, 63, 64, 71, 73;

C.I. pigment violet 1 (hereafter, "C.I. pigment violet" is abbreviated, and only the numbers are indicated), 19, 23, 29, 30, 32, 36, 37, 38, 39, 40, 50;

C.I. pigment red 1 (hereafter, "C.I. pigment red" is abbreviated, and only the numbers are indicated), 2, 3, 4, 5, 6, 7, 8, 9, 10, 11, 12, 14, 15, 16, 17, 18, 19, 21,22, 23, 30, 31, 32, 37, 38, 40, 41, 42, 48:1, 48:2, 48:3, 48:4, 49:1, 49:2, 50:1, 52:1, 53:1, 57, 57:1, 57:2, 58:2, 58:4, 60:1, 63:1, 63:2, 64:1, 81:1, 83, 88, 90:1, 97, 101, 102, 104, 105, 106, 108, 112, 113, 114, 122, 123, 144, 146, 149, 150, 151, 155, 166, 168, 170, 171, 172, 174, 175, 176, 177, 178, 179, 180, 185, 187, 188, 190, 192, 193, 194, 202, 206, 207, 208, 209, 215, 216, 217, 220, 223, 224, 226, 227, 228, 240, 242, 243, 245, 254, 255, 264, 265;

C.I. pigment blue 1 (hereafter, "C.I. pigment blue" is abbreviated, and only the numbers are indicated), 2, 15, 15:3, 15:4, 15:6, 16, 22, 60, 64, 66;

C.I. pigment green 7, C.I. pigment green 36, C.I. pigment green 37;

C.I. pigment brown 23, C.I. pigment brown 25, C.I. pigment brown 26, C.I. pigment brown 28; and C.I. pigment black 1, C.I. pigment black 7.

Further, carbon black may be preferably used as a black pigment.

The above-exemplified organic pigments may be purified by recrystallization with sulfuric acid, washing with a solvent, or by a combination of these purification methods.

For adjusting the color of the colorant (C), one or more types of colorants may be used in combination.

The amount of the colorant (C) to be added can be appropriately selected depending on the desired color. However, when an organic pigment is used, the colorant (C) is preferably added in an amount within the range of 0.1 to 40 parts by weight, more preferably 1 to 35 parts by weight, relative to 100 parts by weight of the component (A). When the amount of the colorant (C) is at least as large as the lower limit of the above-mentioned range, a fine color can be obtained. On the other hand, when the amount of the colorant (C) is no more than the upper limit of the above-mentioned range, lowering of photosensitivity can be prevented.

Organic Solvent

In the photosensitive resin composition of the present invention, an organic solvent may be added for improving the coatability of the composition and adjusting the viscosity of the composition.

Specific examples of Organic solvents include benzene, toluene, xylene, methyl ethyl ketone, acetone, methyl isobutyl ketone, cyclohexanone, methanol, ethanol, propanol, butanol, hexanol, cyclohexanol, ethylene glycol, diethylene glycol, glycerin, ethylene glycol monomethyl ether, ethylene glycol monoethyl ether, propylene glycol monomethyl ether, propylene glycol monoethyl ether, diethylene glycol monomethyl ether, diethylene glycol monoethyl ether, diethylene glycol dimethyl ether, diethylene glycol diethyl ether, 3-methoxybutyl acetate, 3-methyl-3-methoxybutyl acetate, propylene glycol monomethyl ether acetate (PGMEA), propylene glycol monomethyl ether propionate, propylene glycol monoethyl ether propionate, methyl carbonate, ethyl carbonate, propyl carbonate and butyl carbonate. Among these organic solvents, PGMEA is preferable.

The amount of the organic solvent used is not particularly limited, and can be appropriately selected within the range of concentration which enables application of the composition on a substrate, depending on the thickness of the film to be formed. For example, the organic solvent can be used in an amount such that the solid fraction content preferably falls within the range of 5 to 100% by weight, more preferably 10 to 40% by weight.

In addition, various additives such as a sensitizer, an anti-foaming agent and a surfactant may be added to the photosensitive resin composition.

As a sensitizer, any of those which have conventionally been used for a positive-type resist may be used. Examples of such sensitizers include compounds having a molecular weight of not more than 1,000 and having phenolic hydroxyl groups.

As an anti-foaming agent, any of those conventionally known may be used, such as silicone-type anti-foaming agents and fluorine-type anti-foaming agents.

As a surfactant, any of those conventionally known may be used, such as anionic surfactants, cationic surfactants and nonionic surfactants.

The photosensitive resin composition of the present invention may be produced as follows.

The component (A), component (B), an organic solvent, and optionally any other additives are mixed (dispersed and blended) by using a triple roll mill, ball mill or sand mill, followed by filtering with a 5 μm-membrane filter.

The photosensitive resin composition of the present invention can be preferably used for forming a black matrix and/or color layer constituting a color filter.

Hereinbelow, explanation is given of an example of the method for forming a light-proof layer (such as a black matrix) or a color layer using the photosensitive resin composition of the present invention.

Firstly, the photosensitive resin composition is applied onto a substrate using a contact transfer-type coating apparatus such as a roll coater, reverse coater or a bar coater, or a non-contacting-type coater such as a spinner (rotary coating apparatus) or curtain flow coater. As the substrate, a light-transmitting substrate is used. For example, a glass substrate having a thickness of 0.5 to 1.1 mm can be used.

For improving the adhesiveness between the glass substrate and the photosensitive resin composition, the glass substrate may be coated with a silane coupling agent prior to the application of the photosensitive resin composition. Alternatively, the silane coupling agent may be added during the production of the photosensitive resin composition.

Following the application of the photosensitive resin composition, the resulting substrate having a film formed thereon is dried to remove the solvent. The method for drying is not particularly limited, and any of the following methods may be used: (1) a method in which the glass substrate is dried on a hot plate for 60 to 120 seconds at a temperature of 80 to 120° C., and preferably 90 to 110° C.; (2) a method in which the glass substrate is allowed to stand at room temperature for a few hours to a few days; and (3) a method in which the glass substrate is placed in a warm-air heater or infrared heater for a few tens of minutes to a few hours to thereby remove the solvent.

Subsequently, the film formed on the glass substrate is partially exposed to irradiation of active energy rays such as ultraviolet rays or excimer laser beams through a positive mask. The amount of energy ray to be irradiated depends on the formulation of photosensitive resin composition used, but is preferably within the range of about 30 to 2,000 mJ/cm$^2$.

Following the exposure, the film is subjected to developing using a developing solution to thereby form a pattern having the desired shape.

The developing method is not particularly limited. For example, an immersion method, a spraying method or the like may be used.

Specific examples of developing solutions include organic-type developing solutions such as monoethanolamine, diethanolamine and triethanolamine; and aqueous solutions of sodium hydroxide, potassium hydroxide, sodium carbonate, ammonia and tertiary ammonium salt.

Following the development, postbaking is performed to cure the pattern. Further, it is preferable to expose the entire pattern formed.

Since the photosensitive resin composition is of a positive type, a half tone mask may be used as the mask, so as to form a pattern having different thicknesses in one step.

By the present invention, a positive photosensitive resin composition having excellent heat resistance and transparency can be provided.

More specifically, even when the photosensitive resin composition is heated to a fairly high temperature in the production process, the resin component is hardly discolored, and hence, a color layer for a color filter can be obtained which exhibits a fine color. Further, the film produced from the photosensitive resin composition hardly suffers change in the film thickness (thickness loss) by heating, and hence, a color layer or light-proof layer (such as a black matrix) having a desired size can be formed.

In addition, the photosensitive resin composition of the present invention exhibits excellent resolution, and hence, it can satisfy various requirements in ultrafine processing. Especially, the photosensitive resin composition of the present invention is effective when it is used for producing a color filter having a color layer of RGB, CMY (Cyan, Magenta, Yellow) or the like.

Thus, the photosensitive resin composition of the present invention is preferable as a photosensitive resin composition for forming a light-proof layer such as a black matrix. In such a case, in consideration of heat resistance, it is preferable to include a pigment in the photosensitive resin composition.

Also, the photosensitive resin composition of the present invention is preferable as a photosensitive resin composition for forming a color layer of a color filter. In such a case, in consideration of heat resistance, it is preferable to include a pigment in the photosensitive resin composition.

With respect to the photosensitive resin composition of the present invention, a pattern formed following a heat treatment at 230° C. preferably exhibits a transmittance of 70% or more of light having a wavelength within the entire range from 400 to 800 nm. The transmittance is more preferably 80% or more, still more preferably 90% or more. When the pattern formed exhibits a transmittance within the above-mentioned range, the pattern (color layer) exhibits a fine color, especially a pattern formed from a photosensitive resin composition including a pigment.

Herein, "a transmittance of light having a wavelength of 400 to 800 nm, as measured with respect to a pattern following a heat treatment at 230° C." is the value measured in the same manner as in the working examples with respect to a pattern following a heat treatment performed in the same manner as in "Test 1" and "Test 2".

Further, with respect to the photosensitive resin composition according to the present invention, a pattern formed following a heat treatment at 250° C. preferably exhibits a transmittance of 80% or more, and more preferably 90% or more of light having a wavelength of 450 nm.

Herein, "a transmittance of light having a wavelength of 450 nm, as measured with respect to a pattern following a heat treatment at 250° C." is the value measured in the same manner as in the working examples with respect to a pattern following a heat treatment performed in the same manner as in "Test 3".

Especially, when the alkali-soluble resin component (A) includes the above-mentioned structural unit (a1-1) (particularly the above-mentioned structural unit "PQMA") the transmittance of light within the visible range becomes 80% or more, or 90% or more. Therefore, it is particularly desirable that the component (A) include the above-mentioned structural unit (a1-1).

EXAMPLE 1

A photosensitive resin composition having a solid fraction content of 40% by weight was produced by mixing the following materials as the components of the composition.

Component (A): 100 Parts by weight of a homopolymer consisting of the above-mentioned structural unit "PQMA" (Mw: 3,000)

Component (B): 30 Parts by weight of an esterification product of 1 mole of 1-[1-(4-hydroxyphenyl)isopropyl]-4-[1,1-bis(4-hydroxyphenyl)ethyl]benzene and 2 moles of 1,2-naphthoquinonediazide-5-sulfonic acid chloride Sensitizer: 20 Parts by weight of 4-(3-hydroxyspiro[5,6,7,8,10a,8a-hexahydroxanthene-9,1'-cyclohexane]-10a-yl)benzene-1,3-diol Surfactant: 0.1 Part by weight of XR-104 (trade name; manufactured by Dainippon Ink and Chemicals, Inc.)

Organic solvent: PGMEA (Transmittance, Change in Film Thickness)

The transmittance and change in film thickness of the photosensitive resin composition produced was evaluated with respect to patterns formed in the following Tests 1 to 3.

(Test 1)

The photosensitive resin composition was applied to a glass substrate, and heated at 110° C. for 90 seconds, thereby forming a photosensitive-resin layer having a thickness of 2,000 nm. Then, using an exposure apparatus Nikon i10D (product name; manufactured by Nikon Corporation), pattern exposure was conducted through a mask at 100 mJ/cm², followed by developing with a 2.38% by weight aqueous solution of tetramethylammonium hydroxide (TMAH), thereby forming a dotted pattern having a size of 2 μm×2 μm square.

Subsequently, the formed pattern was entirely subjected to exposure at 500 mJ/cm² using the above-mentioned exposure apparatus, followed by a primary heating treatment at 140° C. for 5 minutes. Then, the resulting pattern was subjected to a secondary heating at 200° C. for 5 minutes.

(Test 2)

The pattern obtained in Test 1 was subjected to a secondary heating at 230° C. for 2.5 hours.

(Test 3)

The pattern obtained in Test 1 was subjected to a secondary heating at 250° C. for 1 hour.

With respect to the pattern formed in Tests 1 to 3, the transmittance was evaluated using UV-2500PC (apparatus name; manufactured by Shimadzu Corporation).

Figure 2:
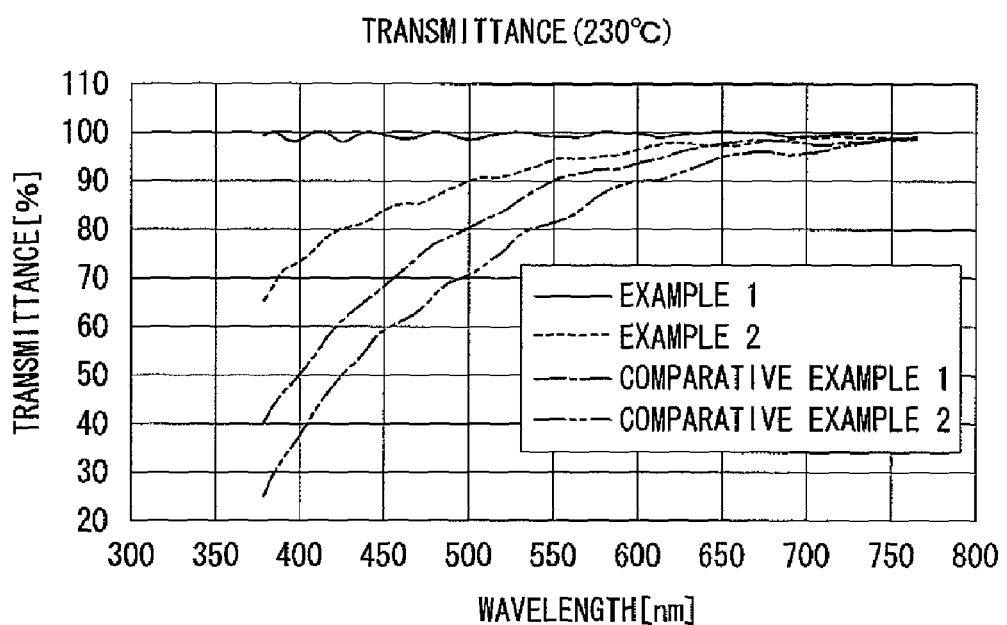
FIG. 2 is a graph showing the transparency of the respective test specimens heated at 230° C. in Examples 1 and 2 and Comparative Examples 1 and 2.
Figure 3:
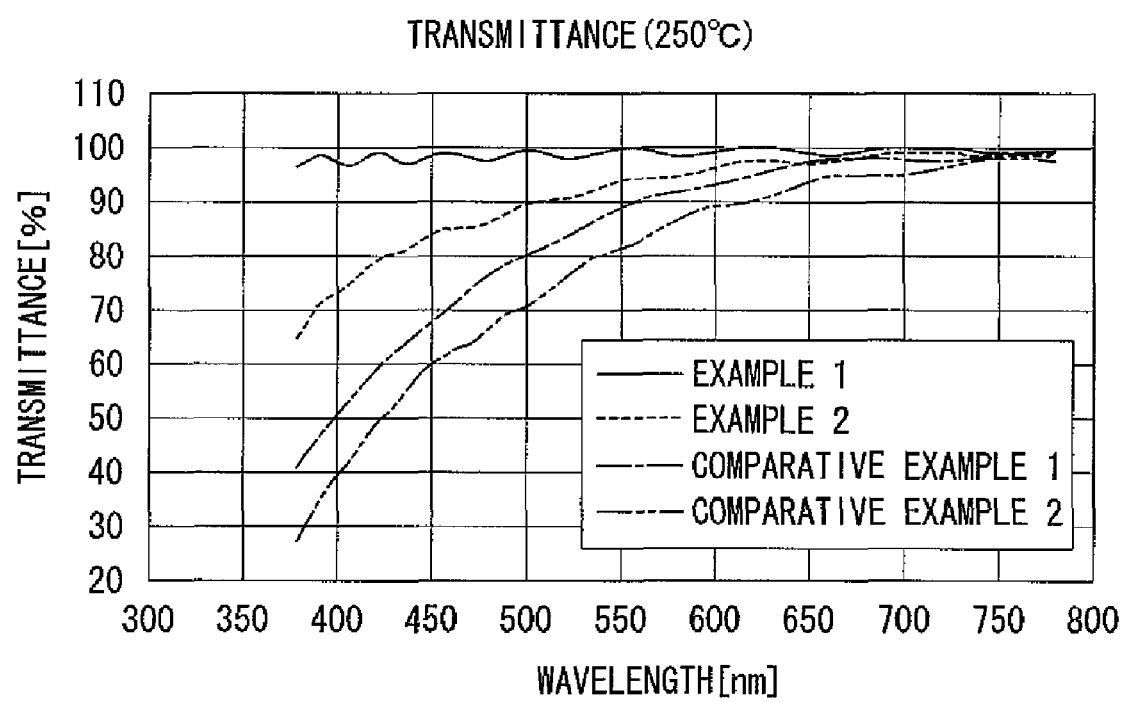
FIG. 3 is a graph showing the transparency of the respective test specimens heated at 250° C. in Examples 1 and 2 and Comparative Examples 1 and 2.

Specifically, the transmittance of each of the patterns at a wavelength of 450 nm is shown in Table 1. Further, with respect to the patterns formed in Tests 1 to 3, namely, respective patterns following the secondary heating treatments at 200° C., 230° C. and 250° C., the transmittance of each of the patterns within the visible range (wavelength of 375 nm to 775 nm) is indicated in FIGS. 1 to 3.

Furthermore, the thickness of each of the formed patterns following the secondary heating treatment was measured, and the percentage of the film thickness, based on the film thickness of the photosensitive resin composition applied on the glass substrate is indicated in Table 2.

(Shape of Pattern)

The shape of each of the patterns formed in the above-mentioned tests was evaluated by observation. The results are shown in Table 3.

(Resolution)

The resolution was evaluated as follows.

Firstly, a photosensitive resin composition was applied onto a glass substrate by spin coating, followed by drying on a hot plate at 110° C. for 90 seconds, thereby forming a photosensitive resin composition layer having a film thickness of 1 μm. Then, pattern exposure was conducted through a mask at 100 mJ/cm², followed by developing with a 2.38% by weight aqueous solution of TMAH, thereby forming a pattern. The resolution of the pattern was evaluated by the minimum width of a space which can be resolved (i.e., width of the space between the dots). The results are shown in Table 3.

EXAMPLE 2

A positive photosensitive resin composition was produced and evaluated in substantially the same manner as in Example 1, except that a homopolymer consisting of the above-mentioned structural unit "PEMA" (Mw: 6,000) was used as the component (A).

The results are shown in Tables 1 to 3 and FIGS. 1 to 3.

COMPARATIVE EXAMPLE 1

A positive photosensitive resin composition was produced and evaluated in substantially the same manner as in Example 1, except that a homopolymer consisting of a structural unit represented by the chemical formula shown below was used as the component (A).

The results are shown in Tables 1 to 3 and FIGS. 1 to 3.

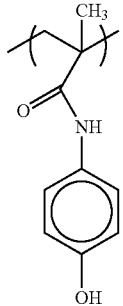

[Chemical Formula 6]

COMPARATIVE EXAMPLE 2

A positive photosensitive resin composition was produced and evaluated in substantially the same manner as in Example 1, except that a hydroxystyrene homopolymer (Mw: 10,000) was used as the component (A).

The results are shown in Tables 1 to 3 and FIGS. 1 to 3.

TABLE 1

|  | Test 1 (%) | Test 2 (%) | Test 3 (%) |
|---|---|---|---|
| Example 1 | 99.6 | 98.8 | 98.6 |
| Example 2 | 98.8 | 83.7 | 84.3 |
| Comparative | 97.2 | 67.8 | 67.6 |

TABLE 1-continued

|  | Test 1 (%) | Test 2 (%) | Test 3 (%) |
|---|---|---|---|
| Example 1 Comparative Example 2 | 98.2 | 58.9 | 59.6 |

TABLE 2

|  | Test 1 (200° C.) | Test 2 (230° C.) | Test 3 (250° C.) |
|---|---|---|---|
| Example 1 | 85% | 80% | 80% |
| Example 2 | 93% | 75% | 74% |
| Comparative Example 1 | 85% | 49% | 49% |
| Comparative Example 2 | 88% | 68% | 71% |

TABLE 3

|  | Example 1 | Example 2 | Comparative Example 1 | Comparative Example 2 |
|---|---|---|---|---|
| Test 1 (200° C.) | ○ | ○ | x | x |
| Test 2 (230° C.) | ○ | ○ | x | x |
| Test 3 (250° C.) | ○ | ○ | x | x |
| Resolution (μm) | 0.3 | 0.3 | 0.3 | 0.5 |

○: Almost no collapse of the shape of the pattern by heating
x: Shape of pattern collapses by heating From the results of Tables 1 and 2, it was found that the photosensitive resin composition of the present invention has satisfactory heat resistance, and the transmittance is hardly lowered by heating. Therefore, it was confirmed that the photosensitive resin composition of the present invention is hardly discolored by heat. Further, it was found that the percentage of change in film thickness by heating (thickness loss (shrinkage)) was small.

Furthermore, from the results of Table 3, it was confirmed that the shape of a pattern formed from the photosensitive resin composition of the present invention was hardly changed by heating, and that the resolution was excellent.

EXAMPLE 3

To the photosensitive resin composition of Example 1, 30 parts by weight of a pigment dispersion were added (CF blue UM; manufactured by Mikuni Color Ltd.), relative to 100 parts by weight of the component (A), thereby producing a pigment-containing photosensitive resin composition. Then, using the produced pigment-containing photosensitive resin composition, a dotted pattern having a size of 2 μm×2 μm square was formed in the same manner as in Example 1.

As a result, a pattern could be formed without any problems. Further, the formed pattern was heated in the same manner as in Tests 1 to 3 in Example 1. As a result, no collapse of the pattern was observed, and no discoloration of the pattern was observed.

Therefore, it was confirmed that a color layer of a color filter with a fine color could be produced.

INDUSTRIAL APPLICABILITY

By the present invention, a positive photosensitive resin composition exhibiting excellent heat resistance and transparency can be provided. Therefore, the photosensitive resin composition of the present invention can be advantageously used for a light-proof layer such as a black matrix. Further, the photosensitive resin composition of the present invention can be advantageously used for a color layer of a color filter. In addition, by the present invention, a color filter exhibiting excellent heat resistance and transparency can be provided.

The invention claimed is:

1. A photosensitive resin composition comprising an alkali-soluble resin component (A) and a photosensitizer (B), said component (A) comprising a resin component (A1) having a structural unit (a1) represented by general formula (a1) shown below:

[Chemical Formula 1]

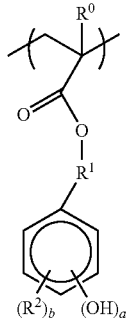

(a1)

wherein $R^0$ represents a hydrogen atom or a methyl group; $R^1$ represents a single bond or an alkylene group of 1 to 5 carbon atoms; $R^2$ represents an alkyl group of 1 to 5 carbon atoms; and a represents an integer of 1 to 5, and b represents 0 or an integer of 1 to 4, with the proviso that the sum of a and b is 5 or less, and when two or more $R^2$ are present, $R^2$ may be the same or different, wherein the amount of the structural unit (a1) based on the combined total of all structural units constituting the resin component (A1) is 100 mol %, and the content of the component (A1) within the component (A) is 100 mol %, wherein said photosensitizer (B) is a guinonediazide group-containing compound.

2. The photosensitive resin composition according to claim 1, wherein a formed pattern following a heat treatment at 230° C. exhibits a transmittance of 70% or more of light having a wavelength from 400 to 800 nm.

3. The photosensitive resin composition according to claim 1, wherein a formed pattern following a heat treatment at 250° C. exhibits a transmittance of 80% or more of light having a wavelength of 450 nm.

4. The photosensitive resin composition according to claim 1, which further comprises a colorant (C).

5. The photosensitive resin composition according to claim 4, wherein said colorant (C) is a black pigment.

6. A color filter provided with a color layer and/or a light-proof layer made of the photosensitive resin composition of claim 4 or 5.

7. The photosensitive resin composition according to claim 1, wherein said quinoneduiazide group-containing compound is an esterification product or a partial esterification product of a phenolic compound with a naphthoquinonediazidesulfonic acid compound.

8. The photosensitive resin composition according to claim 1, wherein said photosensitive resin composition is a positive photosensitive resin composition.

* * * * *